United States Patent [19]

Ichikawa et al.

[11] Patent Number: 6,011,273
[45] Date of Patent: Jan. 4, 2000

[54] THIN-FILM SEMICONDUCTOR DEVICE HAVING PRESSURE SENSITIVE AND NON-SENSITIVE REGIONS

[75] Inventors: Hiroaki Ichikawa, Kanagawa; Hisashi Kadota, Kagoshima, both of Japan

[73] Assignee: Sony Corporation, Tokyo, Japan

[21] Appl. No.: 08/917,965

[22] Filed: Aug. 27, 1997

[30] Foreign Application Priority Data

Aug. 27, 1996 [JP] Japan ................ P08-244309

[51] Int. Cl.[7] ............................................ H01L 29/78
[52] U.S. Cl. .................... 257/57; 257/252; 257/233; 257/254; 257/417; 257/418; 257/419; 338/99
[58] Field of Search ......................... 257/57, 226, 233, 257/254, 417, 418, 419; 339/99; 73/29.03, 29.05, 31.04, 31.05

Primary Examiner—Fetsum Abraham
Attorney, Agent, or Firm—Ronald P. Kananen; Rader, Fishman & Grauer PLLC

[57] ABSTRACT

The present invention provides a thin-film semiconductor device suitable for an areal-pressure-distribution detector and the like. The thin-film semiconductor device according to the present invention comprises an insulating substrate 1, and element regions R being integrated and arranged on the substrate in the form of a matrix and each including a set of mutually connected electrode 2 and thin-film transistor 3. Each electrode 2 senses a signal voltage applied from above the element region R. Meanwhile, the thin-film transistor 3 are on/off-controlled in order and detect the signal voltage applied to the corresponding electrodes 2. In each element region, the surface level H1 of the sensitive region SR where the major part of the electrode 2 is formed is higher by ΔH than the surface level H2 of the non-sensitive region NSR where the corresponding thin-film transistor 3 and a wiring pattern 9 are formed.

12 Claims, 4 Drawing Sheets

THIN-FILM SEMICONDUCTOR DEVICE HAVING PRESSURE SENSITIVE AND NON-SENSITIVE REGIONS

BACKGROUND OF THE INVENTION

1. Field of the Invention

The present invention relates to a thin-film semiconductor device used for an areal-pressure-distribution detector or the like, and more particularly, relates to an electrode structure of a semiconductor device.

2. Description of the Related Art

As disclosed in Japanese Unexamined Patent Publication No. 6-288846, matrix-type areal-pressure-distribution detectors are known in which semiconductor devices and others are used. FIG. 8 schematically shows an example of a conventional fingerprint sensor to which such an areal-pressure distribution detector is applied. This fingerprint sensor comprises a semiconductor substrate 201 such as a silicon substrate, and an integrated detecting member 202 formed on the substrate according to a semiconductor-manufacturing process. A flexible film 203 is further laminated on the semiconductor substrate 201. This film 203 is made of, for example, polyester or polyamide, and a conductive film is formed under the film according to vapor deposition or the like. Among the bipolar transistors constituting the detecting member 202, only emitter electrodes are illustrated in FIG. 8. The emitter electrodes are separated from each other by a silicon oxide film 204. For fingerprint detection, a subject finger 205 is put and slightly pressed on the film 203. At the sites where cutaneous ridges touch, the conductive film formed under the flexible film 203 comes into contact with emitter electrodes of the transistors constituting the detecting member 202 situated under the conductive film. Here, the conductive film formed under the flexible film 203 is grounded. As a result, the emitter electrodes are earthed through the conductive film. The thus-input signal voltages are read by transistors, respectively, and the areal-pressure distribution is determined to detect a fingerprint. Incidentally, an anisotropic conductive film which has conductivity only in the direction of the film thickness may be used instead of the flexible film 203 to which the conductive film is deposited.

Hitherto, areal-pressure distribution detectors have been formed with bulk-type semiconductor devices each comprising a silicon wafer and integrated transistors formed thereon. Such a silicon wafer is, however, expensive, and requires careful handling since it is readily mechanically broken by a stress added from outside.

SUMMARY OF THE INVENTION

Aiming to solve such problems of the related art, an object of the present invention is to provide, as a substitute for such a bulk-type semiconductor device, a thin-film semiconductor device comprising integrated thin-film transistors.

The thin-film semiconductor device according to the present invention comprises an insulating substrate such as a glass substrate, and element regions integrated and arranged on the substrate in the form of a matrix and each including of mutually connected electrode and thin-film transistor. Each electrode senses a signal voltage applied from above the element region. Meanwhile, the thin-film transistors are on/off-controlled in order and detect the signal voltages applied to the corresponding electrodes. As a feature of the present invention, the element region includes a sensitive region and a non-sensitive region, and the surface level of the sensitive region where the major part of the electrode is formed is higher than that of the non-sensitive region where the corresponding thin-film transistor is formed.

In one embodiment of the present invention, the electrode itself is formed such that the surface level of the sensitive region is higher than that of the non-sensitive region.

In another embodiment of the present invention, a bottom-raising pad is embedded under the electrode such that the surface level of the sensitive region is higher than that of the non-sensitive region. The pad may comprise a conductor which may have an isolated pattern and may be in an electrically floating state.

More specifically, the thin-film transistor may comprise a gate electrode and a semiconductor thin-film which are mutually laminated with the intervention of a gate insulating film, and a wiring pattern connected to the semiconductor thin-film with the intervention of an interlayer insulating film, and the pad may have the same lamination structure as that of the aforementioned thin-film transistor.

Further, the thin-film transistor may have a top-gate structure in which a gate electrode, a gate insulating film and a semiconductor thin-film are laminated in this order from the top. Alternatively, the thin-film transistor may have a bottom-gate structure in which a gate electrode, a gate insulating film and a semiconductor thin-film are laminated in this order from the bottom.

Additionally, the thin-film semiconductor device according to the present invention may further comprise a conductive film as a top surface layer. According to the present invention, electrodes and thin-film transistors are formed on an insulating substrate such as a glass substrate in an integrated manner. A silicon wafer, which has been conventionally used in the related art, is not used in the present invention, and the present invention is, therefore, advantageous in view of cost and handling. Characteristically, in each element region including a sensitive region and a non-sensitive region, the surface level of the sensitive region where the major part of an electrode is formed is higher than that of the non-sensitive region where a corresponding transistor is formed. In other words, the uppermost projecting portion in the element region is formed with the electrode. Due to this structure, when the thin-film semiconductor device is used in an areal-pressure distribution detector or the like, the electrode can detect signal voltages without being affected by noise such as a parasitic electric field generated from the thin-film transistor or wiring patterns. Further, since the electrode is situated in the top position, mechanical stress upon the thin-film transistor due to extrinsic pressure can be reduced by the electrode, and therefore, the thin-film transistor can be effectively protected from breaking or crushing.

DESCRIPTION OF THE PREFERRED EMBODIMENT

The preferred embodiment of the present invention will be illustrated in detail below with reference to the attached drawings.

Figure 1:
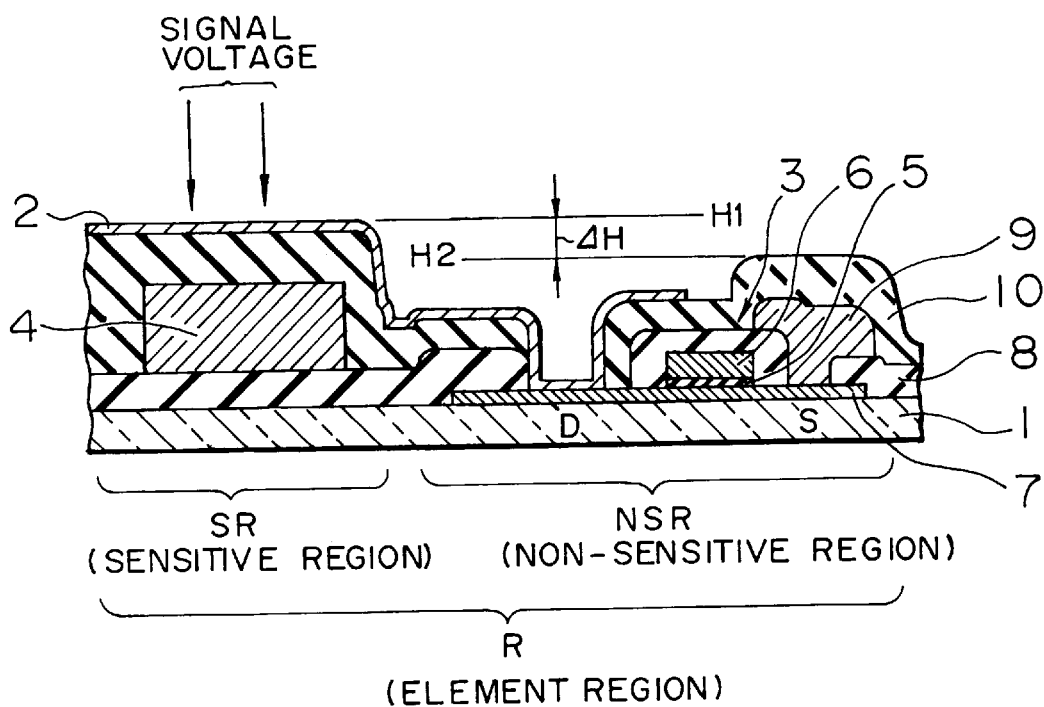
FIG. 1 is a partial sectional view showing the thin-film semiconductor device of Embodiment 1 according to the present invention.

FIG. 1 is a schematic partial sectional view showing the thin-film semiconductor device of Embodiment 1 according to the present invention. As shown in FIG. 1, this thin-film semiconductor device is formed using an insulating substrate 1 comprising glass or the like. On the insulating substrate 1, integrated element regions R are arranged in the form of a matrix, and each element region includes mutually connected electrode 2 and thin-film transistor 3. For the convenience of explanation, only one element region R is illustrated in FIG. 1. The electrode 2 senses a signal voltage respectively applied to the element region R from just above the element region. Meanwhile, the thin-film transistor 3 is on/off-controlled in order, and detects the signal voltage applied to the corresponding electrode 2. As a feature of the present invention, each element region R includes a sensitive region SR and a non-sensitive region NSR, and the surface level H1 of the sensitive region SR where the major part of the electrode 2 is formed is higher by $\Delta H$ than the surface level H2 of the non-sensitive region NSR where the corresponding thin-film transistor 3 is formed. More specifically, a bottom-raising pad 4 is embedded under the electrode 2 such that the surface level H1 of the sensitive region SR exceeds the surface level H2 of the non-sensitive region NSR. In this embodiment, the pad 4 comprises a conductor which has an isolated pattern and is in an electrically floating state.

The thin-film transistor 3 has a lamination structure which comprises a gate electrode 6 and a semiconductor thin-film 7 mutually laminated with the intervention of a gate insulating film 5, and a wiring pattern 9 connected to the semiconductor thin-film 7 with the intervention of a first interlayer insulating film 8. In this embodiment, the thin-film transistor 3 has a top-gate structure in which the gate electrode 6, the gate insulating film 5 and the semiconductor thin-film 7 are laminated in this order from the top. The semiconductor thin-film 7 is deposited on the insulating substrate 1, and patterned in the shape of an island. Both sides of the gate electrode 6 in the thin-film transistor 3 are provided with a drain region D and a source region S, respectively. The aforementioned wiring pattern 9 is connected to the source region S through a contact hole formed in the first interlayer insulating film 8. As is obvious from FIG. 1, the non-sensitive region NSR includes the wiring pattern 9 in addition to the thin-film transistor 3. The thin-film transistor 3 and the wiring pattern 9 are coated with a second interlayer insulating film 10. Obviously from FIG. 1, the surface level H2 of the non-sensitive region NSR is the surface level of the second interlayer insulating film 10 which is situated just above the wiring pattern 9.

Meanwhile, the electrode 2 is also formed on the surface of the second interlayer insulating film 10, and electrically connected to the drain region D of the thin-film transistor 3 through a contact hole formed in the second interlayer insulating film 10 and the first interlayer insulating film 8. This electrode 2 may comprise, for example, a transparent conductive film such as an ITO film, though it is not necessarily limited to such a transparent conductive film. Due to its relatively high chemical stability and mechanical strength, ITO is preferably used for areal-pressure-distribution detection. Alternatively, a metallic film such as an aluminum film may be used for the electrode 2, instead of such an ITO film.

The pad 4 for raising the bottom of the electrode 2 is embedded under the electrode 2 with the intervention of the second interlayer insulating film 10. In this embodiment, the pad 4 is formed with the same material as that of the wiring pattern 9, and has conductivity. Here, the bottom of the electrode 2 is raised by making the pad 4 thicker than the wiring pattern 9. Incidentally, the pad 4 does not necessarily have to be conductive, and may be formed with an insulating material.

Further, the pad 4 comprises the same conductive material as that for the wiring pattern 9, and has an isolated pattern. The conductive pad 4 is, therefore, in an electrically floating state. When a thin-film semiconductor device including such a pad is used for, for example, comparison of seals or fingerprints, extrinsic pressures are frequently impressed upon the electrode 2. In this case, such pressures may cause dielectric breakdown between the electrode 2 and the pad 4. At this time, if the pad 4 is electrically connected to another portion, closed-circuit failure can occur. If such failure occurs, detection of signal voltages may become impossible. To avoid this, in this embodiment the conductive pad 4 formed under the electrode 2 is made to be in an electrically floating state. Even if the electrode 2 as the top layer suffers from damage in the vertical direction to cause an electrical short with the underlying conductive pad 4, no electrical problem occurs since the pad 4 is originally in an electrically floating state. Due to such a floating structure, the thin-film semiconductor device of this embodiment has high reliability, and can be used for various types of areal-pressure-distribution detection. Additionally, such a floating structure can be a preventive measure against electrostatic breakdown. Moreover, such a floating structure prevents generation of a parasitic electric field which might constitute noise for the electrode 2.

Figure 2:
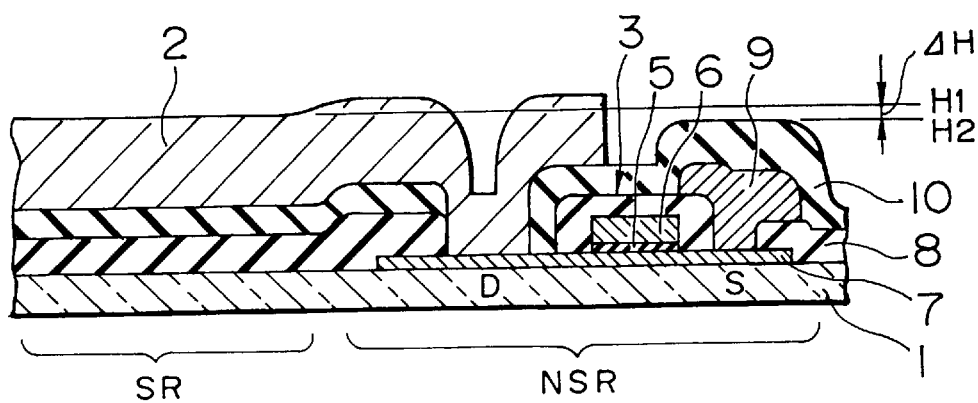
FIG. 2 is a partial sectional view showing the thin-film semiconductor device of Embodiment 2 according to the present invention.

FIG. 2 is a schematic partial sectional view showing the thin-film semiconductor device of Embodiment 2 according to the present invention. For easy understanding, those portions corresponding to like portions in Embodiment 1 shown in FIG. 1 are indicated with the same reference numerals. As a feature of Embodiment 2, the electrode 2 itself is thickened such that the surface level H1 of the sensitive region SR exceeds by $\Delta H$ the surface level H2 of the non-sensitive region NSR. According to this structure, the electrode 2 can be situated higher than the transistor 3 and the wiring pattern 9, and parasitic electric fields generated from portions other than the electrode 2 can be reduced. When the thin-film semiconductor device of this embodiment is used for comparison of seals or fingerprints, extrinsic pressures are frequently impressed. In such a case, an extrinsic force upon the transistor 3 is lowered on the surface of the electrode 2, and therefore, the transistor 3 can be prevented from breaking and crushing. Accordingly, the structure in which the electrode 2 is situated higher is suitable for mechanical protection of the transistor 3.

Figure 3:
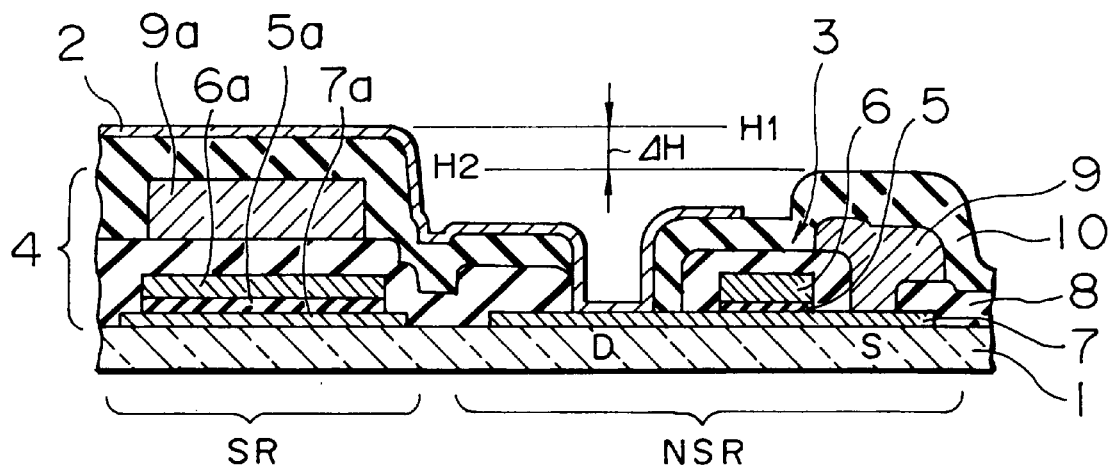
FIG. 3 is a partial sectional view showing the thin-film semiconductor device of Embodiment 3 according to the present invention.

FIG. 3 is a schematic partial sectional view showing the thin-film semiconductor device of Embodiment 3 according to the present invention. For easy understanding, those portions corresponding to like portions in Embodiment 1 shown in FIG. 1 are indicated with the same reference numerals. As a feature of Embodiment 3, the bottom-raising pad 4 embedded under the electrode 2 has the same lamination structure as that of the thin-film transistor 3. More specifically, the thin-film transistor 3 has a lamination structure which comprises a gate electrode 6 and a semiconductor thin-film 7 mutually laminated with the intervention of a gate insulating film 5, and a wiring pattern 9 connected to the semiconductor thin-film 7 through the first interlayer insulating film 8. Meanwhile, the pad 4 is formed employing the lamination structure of the thin-film transistor 3. More specifically, the pad 4 comprises a semiconductor thin-film 7a as a layer identical to the semiconductor thin-film 7, an insulating film 5a as a layer identical to the gate insulating film 5, a conductive film 6a as a layer identical to the gate electrode 6, the first interlayer insulating film 8, and a metallic film 9a as a layer identical to the wiring pattern 9 which are laminated in the described order from the bottom. This embodiment does not require alteration of the process for forming the thin-film transistor 3, and the pad 4 can be formed only by making a mask-pattern modification. All the layers which are deposited during the process for forming the thin-film transistor are laminated under the electrode 2. As a result, the electrode 2 can necessarily be situated at the top. Incidentally, since the thin-film semiconductor device of this embodiment is not a device for a display, the portion under the electrode 2 does not necessarily have to be transparent, and it does not matter at all if the pad 4 includes a metallic film.

For reference, the process for forming the thin-film transistor 3 shown in FIG. 3 will be briefly illustrated below. Initially, as shown in FIG. 3, a semiconductor thin-film 7 comprising polycrystalline silicon is deposited on a thermostable insulating substrate 1 comprising quartz or the like, and patterned into the shape of an island. For example, amorphous silicon is deposited, and then subjected to annealing for solid-phase growth at above 1000° C. to be transformed into polycrystalline silicon. Next, a gate insulating film 5 is deposited on the semiconductor thin-film 7. A high-quality gate insulating film 5 can be obtained by, for example, heat-oxidizing the surface of the semiconductor thin-film 7 at a temperature above 1000° C. Succeedingly, polycrystalline silicon in which impurities are diffused at a high concentration is deposited on the gate insulating film, and then patterned in accordance with a predetermined shape to form a gate electrode 6. Using this gate electrode 6 as a mask, impurities are implanted in the semiconductor thin-film 7 to form a drain region D and a source region S. The thus-obtained top-gate-type thin-film transistor is then coated with a first interlayer insulating film 8 comprising PSG or the like. After a contact hole is formed in the first interlayer insulating film 8, aluminum is deposited by sputtering and is patterned in accordance with a predetermined shape to form a wiring pattern 9. A second interlayer insulating film 10 is then formed so as to coat the wiring pattern 9. Simultaneous with the above-described process, a pad 4 is formed which has a lamination structure. Finally, after a contact hole is formed through the second interlayer insulating film 10 and the first interlayer insulating film 8, a material such as ITO is deposited by sputtering, and is patterned in accordance with a predetermined shape to form an electrode 2. As described above, in this embodiment, a top-gate-type thin-film transistor 3 is formed through the processes performed at 1000° C. or higher, and therefore, a high-quality thin-film semiconductor device can be obtained.

Figure 4:
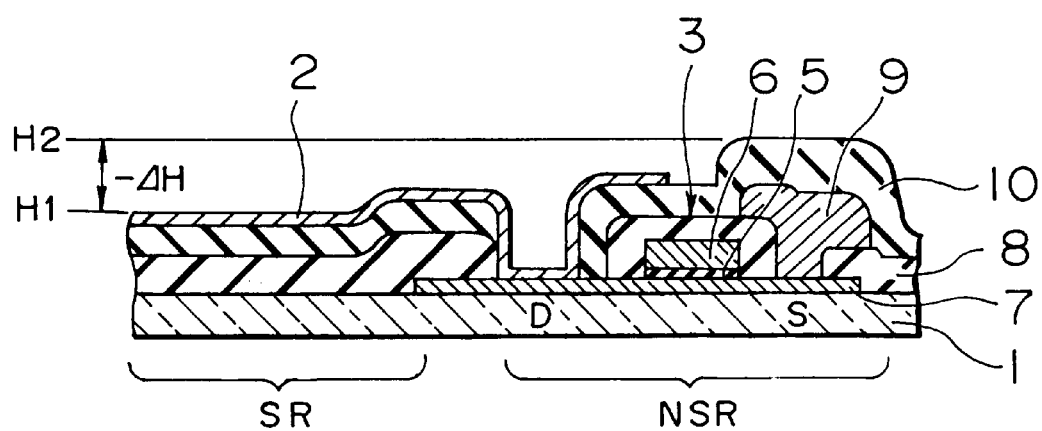
FIG. 4 is a partial sectional view showing the thin-film semiconductor device of Referential Example 1.

FIG. 4 is a schematic partial sectional view showing the thin-film semiconductor device of Referential Example 1. For easy understanding, those portions corresponding to like portions in Embodiment 1 shown in FIG. 1 are indicated with the same reference numerals. In Referential Example 1, no bottom-raising pad is embedded under the electrode 2. The surface level H1 of the sensitive region SR is, therefore, lower by ΔH than the surface level H2 of the non-sensitive region NSR. In such a structure, the electrode 2 is readily affected by parasitic electric fields generated from the transistor 3 and the wiring pattern 9. Further, extrinsic pressures directly reach the thin-film transistor 3 without being lowered, namely, the transistor 3 readily suffers from mechanical breakage or crushing.

Figure 5:
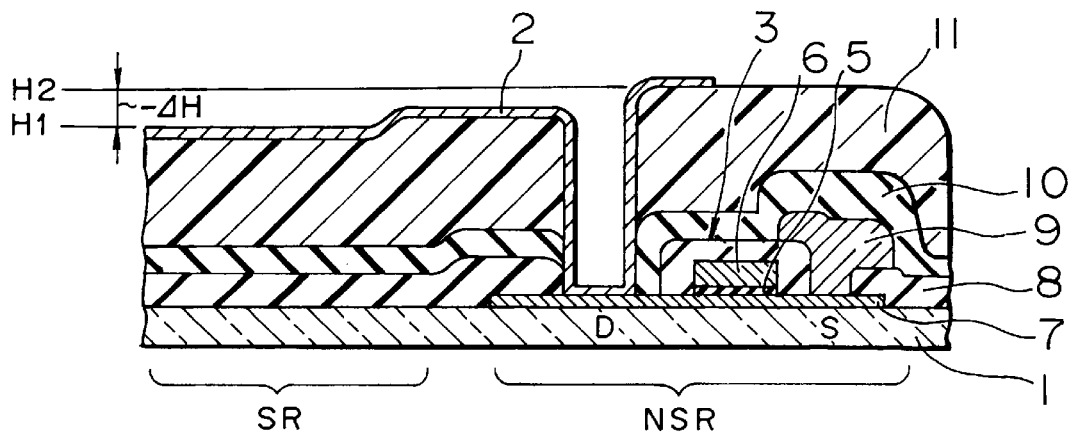
FIG. 5 is a partial sectional view showing the thin-film semiconductor device of Referential Example 2.

FIG. 5 is a schematic partial sectional view showing the thin-film semiconductor device of Referential Example 2. For easy understanding, those portions corresponding to like portions in Referential Example 1 shown in FIG. 4 are indicated with the same reference numerals. In Referential Example 2, a resin film 11 is applied onto the second interlayer insulating film 10, and the electrode 2 is formed thereon. In this structure, however, the entire surface level of the insulating substrate 1 is merely raised, and the surface level H1 of the sensitive region SR is not necessarily higher than the surface level H2 of the non-sensitive region NSR. Additionally, the application of the resin film 11 causes a limitation in the processing temperatures of the succeeding steps. For example, when the electrode 2 is formed with ITO or the like by deposition, deposition must be carried out at a low temperature, and as a result, the electrode 2 can rarely possess superior mechanical hardness.

Figure 6:
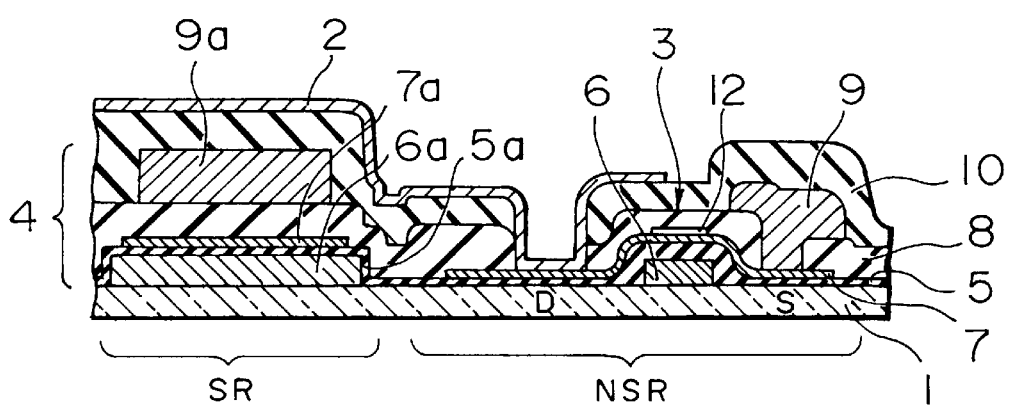
FIG. 6 is a partial sectional view showing the thin-film semiconductor device of Embodiment 4 according to the present invention.

FIG. 6 is a schematic partial sectional view showing the thin-film semiconductor device of Embodiment 4 according to the present invention. For easy understanding, those portions corresponding to like portions in Embodiment 3 shown in FIG. 3 are indicated with the same reference numerals. As a feature of this embodiment, the thin-film transistor 3 has a bottom gate structure comprising a gate electrode 6, a gate insulating film 5 and a semiconductor thin-film 7 which are laminated in the described order from the bottom. In accordance with this structure, the pad 4 has a lamination structure comprising a conductive layer 6a as a layer identical to the gate electrode 6, an insulating layer 5a as a layer identical to the gate insulating film 5, a semiconductor thin-film 7a as a layer identical to the aforementioned semiconductor thin-film 7, a first interlayer insulating film 8, and a metallic film 9a as a layer identical to the wiring pattern 9 which are laminated in the described order from the bottom.

The thin-film transistor 3 having such a bottom gate structure can be formed at a relatively lower temperature, as compared with a thin-film transistor having a top gate structure. Actually, in this embodiment, the processing temperature for forming the bottom-gate-type thin-film transistor 3 was 700° C. or below. According to such a manner, glass, which costs low, can be used for the insulating substrate 1, instead of quartz.

For reference, the process for forming the thin-film transistor 3 shown in FIG. 6 will be briefly illustrated below.

Initially, on an insulating substrate 1 comprising a glass or the like, a metal such as Al, Mo, Ta, Ti and Cr, a high-concentration-doped polycrystalline silicon (DOPOS), or a laminate or an alloy of a DOPOS and such a metal is deposited and then patterned in accordance with a predetermined shape to form a gate electrode 6.

Next, a gate insulating film 5 is deposited so as to coat the gate electrode 6. For example, $SiO_2$ or SiNx is deposited to a thickness of 50 to 100 nm by plasma CVD or the like.

Subsequently, a non-single-crystalline silicon is deposited to a thickness of approximately 20 to 100 nm by plasma CVD or LPCVD in order to form an active layer of the thin-film transistor 3. The non-single crystalline silicon is then crystallized by laser annealing or heat annealing. In laser annealing, the non-single crystalline silicon is irradiated with excimer laser pulses or the like to be melted, and then crystallized during a cooling step. According to this manner, for example, an amorphous silicon obtained in the deposition step can be transformed into a polycrystalline silicon by such a process performed at a relatively low temperature.

Next, $SiO_2$ is deposited to a thickness of 100 to 400 nm by plasma CVD or the like. After a photoresist is applied onto this $SiO_2$ film, an exposure treatment is carried out in which the insulating substrate 1 is irradiated from its back using the gate electrode 6 as a mask, and the photoresist is processed into the same shape as that of the gate electrode 6. Using the thus-patterned photoresist as a mask, the $SiO_2$ film is etched to be a channel stopper 12 which is substantially conformed to the gate electrode 6.

Succeedingly, using an ion doping apparatus, impurities are radiated while being accelerated by an electric field to form a source region S and a drain region D in the semiconductor thin-film 7. After this, the impurities are activated by laser annealing or heat annealing. The semiconductor thin-film 7 which has been thus transformed into a polycrystalline silicon from an amorphous silicon is patterned into the shape of an island, and each thin-film transistor is thereby separated from others.

Next, $SiO_2$ is deposited to a thickness of approximately 200 to 600 nm to form a first interlayer insulating film 8. At this time, the deposition may be carried out to to plasma CVD, atmospheric pressure CVD (APCVD), or a low pressure CVD (LPCVD) process. The first interlayer insulating film 8 is then etched to form a contact hole. After this, Mo, Al or the like is deposited by sputtering and processed in accordance with a predetermined shape to form a signal wiring pattern 9. This signal wiring pattern 9 is connected to the source region S through the contact hole. A second interlayer insulating film 10 is then deposited so as to coat the signal wiring pattern 9. Further, a transparent conductive film comprising ITO or the like is deposited by sputtering or the like, and patterned in accordance with a predetermined shape to form an electrode 2. This electrode 2 is connected to the drain region D through another contact hole.

Figure 7:
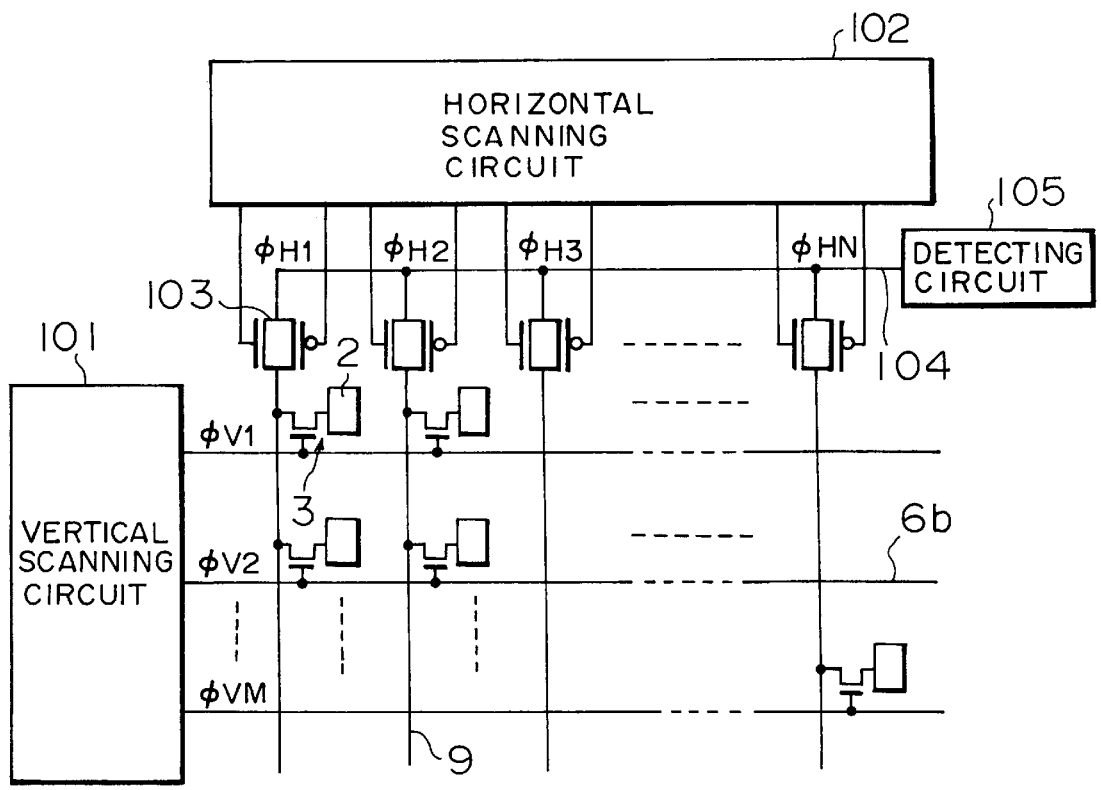
FIG. 7 is an equivalent circuit diagram showing the entire structure of a thin-film semiconductor device according to the present invention.
Figure 8:
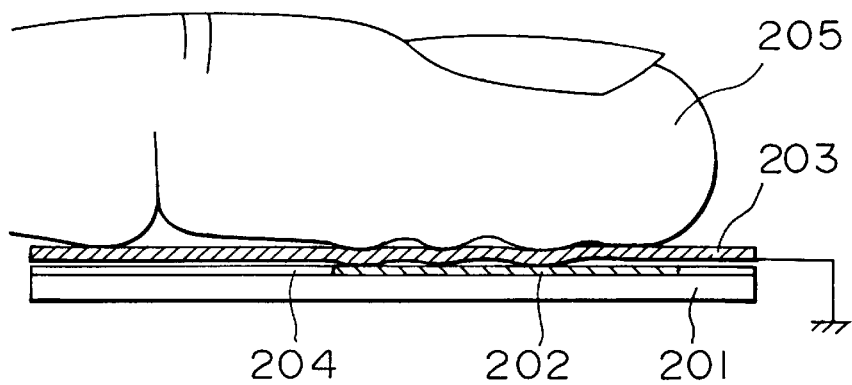
FIG. 8 is a partial sectional view showing an example of a conventional areal-pressure-distribution detector.

FIG. 7 is a schematic plan view showing an example of an areal-pressure-distribution detector to which the thin-film semiconductor device according to the present invention is applied. As shown in FIG. 7, this detector includes a plurality of gate wiring patterns 6b which are arranged in lines, and a plurality of signal wiring patterns 9 which are arranged in rows. Each element region is determined based on a junction formed with a couple of gate wiring pattern and signal wiring pattern, and includes a set of mutually connected electrode 2 and thin-film transistor 3, as described above. The source region of the thin-film transistor 3 is connected to the corresponding signal wiring pattern 9, the drain region is connected to the corresponding electrode 2, and the gate electrode is connected to the corresponding gate wiring pattern 6b. Each gate wiring pattern 6b is connected to a vertical scanning circuit 101. This vertical scanning circuit 101 may be built in the insulating substrate, or externally provided. The vertical scanning circuit 101 successively outputs pulses $\phi_{V1}, \phi_{V2}, \ldots \phi_{VM}$ to vertically scan the gate wiring patterns 6b, and selects the electrodes 2 included in one line for each horizontal period. Further, the detector includes a built-in or external horizontal scanning circuit 102. The horizontal scanning circuit successively scans each signal wiring pattern 9 within on horizontal scanning period, samples a signal voltage from each electrode 2, and reads signal voltages from the selected electrodes 2 included in one line in a dot sequential manner. More specifically, each signal wiring pattern 9 is connected to a signal line 104 through a switch 103, and the read signal voltages are sent to a detecting circuit 105. The horizontal scanning circuit 102 successively outputs sampling pulses $\phi_{H1}, \phi_{H2}, \phi_{H3}, \ldots \phi_{HN}$, on-off, drives each switch 103, and samples signal voltages from the signal wiring patterns 9. Additionally, the surfaces of the electrodes 2 arranged in the form of a matrix are coated with an anisotropic conductive film, and signal voltages corresponding to extrinsically impressed pressure are transmitted to the electrodes 2, respectively. Through the above-described process, an areal-pressure-distribution detector can be obtained, the detector having a structure which comprises an insulating substrate including thin-film transistors and electrodes in the form of a matrix, and an anisotropic conductive film laminated thereon. According to the present invention, the positions of the electrodes 2 detecting areal pressures are situated higher than those of the transistors 3 used for switching, and the wiring patterns 6b and 9. This structure has the effect of reducing noises such as parasitic electric fields generated from components other than the electrodes 2. Incidentally, this areal-pressure-distribution detector is based on the principle as follows: Only the portions of the anisotropic conductive film where an areal pressure is impressed are bent down to be conductively connected to the corresponding electrodes 2, while the portions that do not receive downard pressures are not bent down and are not conductively connected. In the detector, switching is successively caused in the transistors according to the above-described dot sequential scanning method, and the contact portions are detected as signal voltages or signal currents. The detected signal voltages are analyzed by the detecting circuit 105, and an image pattern in response to the areal-pressure distribution can be thereby recognized.

As described above, according to the present invention, an areal-pressure-distribution detector or the like is composed based on a structure including a thin-film semiconductor device comprising an insulating substrate and element regions being arranged thereon in the form of a matrix and each including a set of mutually connected electrode and thin-film transistor. In contrast to conventional structures where silicon wafers are used, the structure according to the present invention can be achieved at a low cost, and is easy to handle. In particular, in each element region, since the surface level of the sensitive region where the major part of an electrode is formed is higher than that of the non-sensitive region where a corresponding transistor is formed, the sensitive region is rarely affected by noises and the like, and therefore, detection sensitivity can be improved. Further, since the positions of the electrodes are necessarily higher than those of the transistors, the transistors can be protected from extrinsic pressures.

What is claimed is:

1. A thin-film semiconductor device, comprising:
   an insulating substrate; and
   element regions arranged on the insulating substrate in the form of a matrix, each element region including a mutually connected electrode and a corresponding thin-film transistor, each electrode sensing a signal voltage applied to the element region from above the element region, and said thin-film transistors being on/off-controlled and detecting the signal voltages applied to the corresponding electrodes, wherein said element region includes a sensitive region and a non-sensitive region, and wherein a surface level of said sensitive region, where a portion of said electrode is formed, is higher than a surface level of said non-sensitive region where the corresponding thin-film transistor is formed.

2. The thin-film semiconductor device according to claim 1, wherein said electrode is formed such that the surface level of a large portion of said electrode that is in said sensitive region is higher than the surface level of a portion of said electrode in said non-sensitive region.

3. The thin-film semiconductor device according to claim 1, wherein a bottom-raising pad is formed under said electrode such that the surface level of said electrode in said sensitive region is higher than the surface level of said electrode in said non-sensitive region.

4. The thin-film semiconductor device according to claim 3, wherein said pad comprises a conductor.

5. The thin-film semiconductor device according to claim 4, wherein said conductor has an isolated pattern, and is in an electrically floating state.

6. The thin-film semiconductor device according to claim 3, wherein said thin-film transistor comprises a gate electrode and a semiconductor thin-film which are mutually laminated with the intervention of a gate insulating film, and a wiring pattern connected to said semiconductor thin-film through an interlayer insulating film.

7. The thin-film semiconductor device according to claim 6, wherein said pad has the same lamination structure as that of said thin-film transistor.

8. The thin-film semiconductor device according to claim 7, wherein said thin-film transistor has a top-gate structure in which a gate electrode, a gate insulating film and a semiconductor thin-film are laminated in said order from the top.

9. The thin-film semiconductor device according to claim 7, wherein said thin-film transistor has a bottom-gate structure in which a gate electrode, a gate insulating film and a semiconductor thin-film are laminated in said order from the bottom.

10. The thin-film semiconductor device according to claim 1, wherein said thin-film transistor comprises a gate electrode and a semiconductor thin-film which are mutually laminated with the intervention of a gate insulating film, and a wiring pattern connected to said semiconductor thin-film through an interlayer insulating film.

11. The thin-film semiconductor device according to claim 1, wherein said insulating substrate is a glass substrate.

12. The thin-film semiconductor device according to claim 1, wherein said thin-film semiconductor device further comprises a conductive film as a top surface layer.

* * * * *

UNITED STATES PATENT AND TRADEMARK OFFICE
CERTIFICATE OF CORRECTION

PATENT NO. : 6,011,273
DATED : January 4, 2000
INVENTOR(S) : Hiroaki ICHIKAWA et al.

It is certified that error appears in the above-identified patent and that said Letters Patent is hereby corrected as shown below:

Cover sheet, item 54, line 1 et seq., the title should read as follows;
THIN-FILM SEMICONDUCTOR DEVICE Signed and Sealed this Sixth Day of March, 2001

Attest:

NICHOLAS P. GODICI

*Attesting Officer*     Acting Director of the United States Patent and Trademark Office